(12) United States Patent
Okada et al.

(10) Patent No.: US 8,507,104 B2
(45) Date of Patent: Aug. 13, 2013

(54) METAL COATING, FORMING METHOD THEREOF, AND METAL WIRING

(75) Inventors: Issei Okada, Osaka (JP); Kohei Shimoda, Osaka (JP)

(73) Assignee: Sumitomo Electric Industries, Ltd., Osaka-Shi, Osaka (JP)

( * ) Notice: Subject to any disclaimer, the term of this patent is extended or adjusted under 35 U.S.C. 154(b) by 1143 days.

(21) Appl. No.: 11/662,975

(22) PCT Filed: May 17, 2006

(86) PCT No.: PCT/JP2006/309838
§ 371 (c)(1),
(2), (4) Date: Mar. 16, 2007

(87) PCT Pub. No.: WO2006/129482
PCT Pub. Date: Dec. 7, 2006

(65) Prior Publication Data
US 2009/0197045 A1 Aug. 6, 2009

(30) Foreign Application Priority Data

May 30, 2005 (JP) ................. 2005-157676
Mar. 10, 2006 (JP) ................. 2006-066359

(51) Int. Cl.
*C22C 5/06* (2006.01)
(52) U.S. Cl.
USPC .......................................... 428/544; 428/546
(58) Field of Classification Search
USPC ................................. 428/544, 546
See application file for complete search history.

(56) References Cited

U.S. PATENT DOCUMENTS

| | | | | | |
|---|---|---|---|---|---|
| 6,136,228 | A | * | 10/2000 | Hirai et al. | 252/512 |
| 6,228,457 | B1 | | 5/2001 | Ueno et al. | |
| 6,348,295 | B1 | * | 2/2002 | Griffith et al. | 430/198 |
| 2005/0170134 | A1 | * | 8/2005 | Nee | 428/64.4 |

FOREIGN PATENT DOCUMENTS

| | | | |
|---|---|---|---|
| JP | 3-281783 | A | 12/1991 |
| JP | 2000-123634 | A | 4/2000 |
| JP | 2001-35814 | A | 2/2001 |
| JP | 2002-121679 | A | 4/2002 |
| JP | 2002-140929 | A | 5/2002 |
| JP | 2003-13117 | A | 1/2003 |
| JP | 2003-055721 | | 2/2003 |
| JP | 2004-197117 | | 7/2004 |
| JP | 2005-42135 | A | 2/2005 |
| JP | 2005-93800 | A | 4/2005 |

\* cited by examiner

*Primary Examiner* — Matthew Matzek
(74) *Attorney, Agent, or Firm* — McDermott Will & Emery LLP

(57) ABSTRACT

The present invention provides a metal coating formed by baking after applying a metal-nanoparticles-dispersed liquid onto a surface of a base material, the metal-nanoparticles-dispersed liquid being composed of metal nanoparticles, water, and a dispersant having a molecular weight of 2000-30000 and having a solid form at room temperature, wherein the metal coating comprises an alloy including (1) Ag and (2) at least one kind of metal selected from the group consisting of Au, Pt, Pd, Ru, Ir, Sn, Cu, Ni, Fe, Co, Ti and In, the content ratio of Ag being 80-99.9% by atomic percent in the total quantity of the alloy, and wherein the metal coating has an average grain size of 0.2-5 μm. The metal coating has small surface roughness, and superior smoothness and denseness, and has excellent properties for etching and adhesion to a base material. Also, the invention provides a method of forming such metal coating as well as a metal wiring formed by pattern formation of the metal coating.

6 Claims, 1 Drawing Sheet

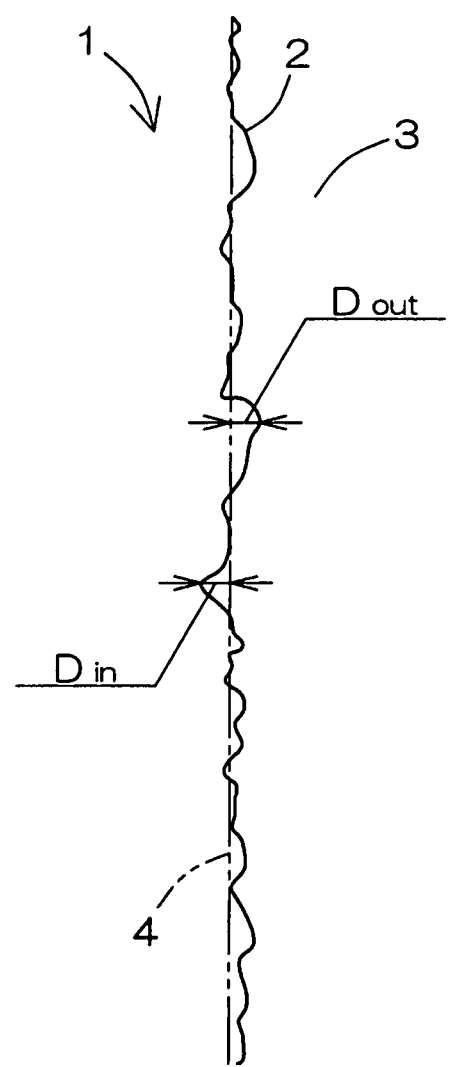

METAL COATING, FORMING METHOD THEREOF, AND METAL WIRING

RELATED APPLICATIONS

This application is the U.S. National Phase under 35 U.S.C. §371 of International Application No. PCT/JP2006/309838, filed on May 17, 2006, which claims priority of JP 2005-157676, filed on May 30, 2005, and JP 2006-066359, filed on Mar. 10, 2006, the disclosures of which applications are incorporated by reference herein.

TECHNICAL FIELD

The present invention relates to a metal coating formed by applying a metal-nanoparticles-dispersed liquid including metal nanoparticles to a base material and baking the applied liquid, a method of forming the metal coating, and a metal wiring formed by pattern formation of the metal coating.

BACKGROUND ART

In recent years, techniques for forming metal coating using metal nanoparticles as a material of metal wiring have caught much attention. For example, Patent document 1 discloses a method of forming a metal coating having a film thickness of 0.01-1 μm, in which method a metallic paste made by uniformly and fully dispersing metallic ultrafine particles having particle sizes of 0.001-0.1 μm in an organic solvent is applied to a surface of a base material and thereafter the metallic paste is dried and baked.

Also, in Patent document 2, a method of forming a metal coating is described, in which method a metal-nanoparticles-dispersed liquid having a viscosity of 1000 cP or less at room temperature is applied onto a surface of a base material and baked after being dried, wherein the metallic nanoparticle dispersed liquid is prepared by dispersing metal nanoparticles consisting of Ag, or silver oxide, etc. and having a size of nano meter level in an organic solvent, which does not easily evaporate at room temperature but evaporates when heated during a process of drying or baking a coated film, in a manner such that the surface of each metallic nanoparticle is covered with the organic solvent and does not cause agglomeration so that an independent condition thereof may be achieved.

Moreover, in Patent document 3, a method of forming a metal coating is described, in which method a Cu independent ultrafine particles dispersed-liquid having a viscosity of 50 cP or less is applied onto a surface of a base material and baked after being dried, wherein the Cu independent ultrafine particles dispersed liquid is prepared by mixing ultrafine particles containing Cu metal particles having a particle size of 0.01 μm or less and an organic solvent, which does not easily evaporate at room temperature but evaporates during drying or baking a coated film in a process of forming a Cu wiring on a semiconductor substrate, and wherein the surface of each Cu independent ultrafine particle is covered with the organic solvent and the individual Cu independent ultrafine particles are independently dispersed.

Patent document 1: Japanese Patent Application Publication No. H 03-281783.
Patent document 2: Japanese Patent Application Publication No. 2001-35814.
Patent document 3: Japanese Patent Application Publication No. 2000-123634.

DISCLOSURE OF THE INVENTION

Problems to be Solved by the Invention

However, according to the examination of the present inventors, metal coatings formed by any of the inventions described in the above-mentioned patent documents have shortcomings: the surface is so rough that there is a problem in terms of smoothness and denseness of the metal coating. Also, the metal coating has problems to be solved in respect of adhesion to the base material and the ease of processing by etching.

The objects of the present invention are to provide a metal coating having small surface roughness and superior in terms of the smoothness and the denseness and having excellent properties for etching and adhesion to a base material, to provide a method of forming such metal coating, and to provide a metal wiring formed by pattern formation of the metal coating.

Means for Solving the Problems to be Solved

A first aspect of the invention in the present patent application is a metal coating which is formed by baking after applying a metal-nanoparticles-dispersed liquid onto a surface of a base material, the metal-nanoparticles-dispersed liquid being composed of metal nanoparticles, water, and a dispersant having a molecular weight of 2000-30000 and having a solid form at room temperature, wherein the metal coating comprises an alloy including (1) Ag and (2) at least one kind of metal selected from the group consisting of Au, Pt, Pd, Ru, Ir, Sn, Cu, Ni, Fe, Co, Ti and In, the content ratio of Ag being 80-99.9% by atomic percent in the total quantity of the alloy, and wherein the metal coating has an average grain size of 0.2-5 μm.

In the first aspect of invention of the present patent application, the dispersant contained in the metal-nanoparticles-dispersed liquid, which is to become a metal coating, exists in a state of surrounding metal nanoparticles in the metal-nanoparticles-dispersed liquid which contains water, and the dispersant performs a function of preventing the metal nanoparticles from agglomeration. Also, the water swells the dispersant well so that the metal nanoparticles surrounded by the dispersant may satisfactorily be dispersed without being agglomerated in the metal-nanoparticles-dispersed liquid. Therefore, by drying after applying a metal-nanoparticles-dispersed liquid to a surface of a base material, it is possible to form a coated film which is dense and smooth and in which a void is not easily generated by baking.

Also, at least one kind of metals used at the above-mentioned ratio relative to Ag performs a function of restraining grain growth of the grain size of Ag during the baking of the coated film, or a function of preventing a metal coating from being easily oxidized, or a function of causing itself to be oxidized, thereby improving the property of the metal coating so as to adhere to the base material which is mainly oxide. Therefore, by baking the coated film, it is possible to form a metal coating having an average grain size limited to 0.2-5 μm and a uniform film thickness, and which is not only smooth and dense without a void and the like, but also superior in the property of adhesion to the base material.

In addition, the metal coating thus formed not only exhibits the same ease of etching as that which consists of only Ag, but also has high conductivity which is equivalent to or nearly equivalent to that of a metal coating which consists of only Ag. Moreover, the above-mentioned metal coating is superior in conductivity, since it has an average grain size that is limited to 0.2-5 μm and the grain boundaries thereof are less. Therefore, according to the first aspect of invention of the present patent application, it is possible to provide a metal coating which has not only smooth and dense film quality but also superior properties in terms of adhesion to a base material, ease of etching, and high conductivity.

A second aspect of the invention in the present patent application is a metal coating which is formed according to the above-described first aspect, wherein the metal coating comprises an alloy including (1) Ag and (2-1) a first metal which is at least one kind of metal selected from the group consisting of Au, Pt, Pd, Ru, and Ir, and (2-2) a second metal which is at least one kind of metal selected from the group consisting of Sn, Cu, Ni, Fe, Co, Ti and In, the content ratio of the second metal being 0.1-2% by atomic percent in the total quantity of the alloy.

In the second aspect of invention of the present patent application, the first metal classified as (2-1) and the second metal classified as (2-2) are both used together with Ag: the former is superior in the properties of restraining grain growth of the grain size of Ag and preventing a metal coating from being easily oxidized during the baking; and the latter is not only superior in the property of restraining the grain growth of the grain size of Ag during the baking, the property of ease in etching, and the property of causing itself to be oxidized during the baking so as to improve the adhesive property of the metal coating with respect to the base material, which is mainly oxide, but also the content ratio of the second metal is defined to be 0.1-2% by atomic percent. Therefore, according to the second aspect of invention, it is possible to produce a metal coating in which the above-described individual characteristics are better exhibited while the characteristics are balanced well.

A third aspect of the invention in the present patent application is a metal coating in which the arithmetic mean roughness Ra is equal to or less than 100 nm, according to the first or second aspect of the present invention. The third aspect of the invention makes it possible to obtain a metal coating in which the surface smoothness and the denseness are further improved by defining the arithmetic mean roughness Ra to be equal to or less than 100 nm.

A fourth aspect of the invention in the present patent application is a metal coating which is set forth in any of the first to third aspects of the present invention and which is formed using a metal-nanoparticles-dispersed liquid that contains a water soluble organic solvent. In the fourth aspect of the present invention, by preparing a metal-nanoparticles-dispersed liquid which contains a water soluble organic solvent, it is made possible to adjust the viscosity of the metal-nanoparticles-dispersed liquid to fall in a range that is optimal for coating method to be adopted in order to apply the metal-nanoparticles-dispersed liquid onto a surface of a base material. In addition, by adjusting the vapor pressure of the metal-nanoparticles-dispersed liquid, it is made possible to adjust the speed of drying to be done after coating, or the like, to the optimum range. Therefore, according to the fourth aspect of the invention, by baking after applying a metal-nanoparticles-dispersed liquid to a surface of a base material, it is made possible to form a metal coating in which the film quality is more smooth and dense and which has no void or the like.

A fifth aspect of the invention in the present patent application is a metal coating which is set forth in any of the first to fourth aspects of the present invention and which is formed using a metal-nanoparticles-dispersed liquid having an electric conductivity of 5 mS/cm or more. According to the fifth aspect of the invention, by defining the electric conductivity of the metal-nanoparticles-dispersed liquid to be 5 mS/cm or more, thereby suitably controlling the electric repulsive force around the metal nanoparticles, it is possible to improve the dispersibility of the metal nanoparticles and the reliability of the dispersion and to form a dense metallic coated film by drying after applying a metal-nanoparticles-dispersed liquid to a base material. Therefore, in the fourth aspect of the invention, by baking the metallic coated film, it is made possible to form a metal coating in which the film quality is more smooth and dense and which has no void or the like.

A sixth aspect of the invention in the present patent application is a method of forming a metal coating set forth in any of the first to fifth aspects of the present invention, the method comprising: a step of applying a metal-nanoparticles-dispersed liquid onto a surface of a base material, the metal-nanoparticles-dispersed liquid being composed of metal nanoparticles, water and a dispersant having a molecular weight of 2000-30000 and having a solid form at room temperature; a step of forming a coated film by drying the so-applied liquid; and a step of forming a metal coating by baking the coated film at a temperature of 700° C. or less.

In the sixth aspect of the invention, a coated film is formed by applying and drying a metal-nanoparticles-dispersed liquid containing the above-described components onto a surface of a base material, and thereafter a metal coating is formed by baking the coated film at a temperature of 700° C. or less so as to prevent excessive growth of grain size or generation of a void or the like. Therefore, the sixth aspect of the invention makes it possible to obtain a metal coating having superior properties with respect to the above-described characteristics.

A seventh aspect of the invention in the present patent application is a metal wiring characterized in that a metal coating that is set forth in any of the first to fifth aspects of the present invention is made by pattern formation. As described herein above, in the first to fifth aspects of the invention, it is possible to form a metal coating which has not only smooth and dense film quality but also superior properties in terms of adhesion to a base material, ease of etching, and high conductivity. Therefore, according to the seventh aspect of the invention, by forming the metal coating in a pattern of minute planar shape, in which the thickness is 1 μm or less and in which the line width and the line interval are both equal to or less than several tens of μm, for example, it is possible to obtain metal wiring in which the individual micro pattern regions exhibit superior properties with respect to the above-mentioned characteristics and which has particularly excellent conductivity.

An eighth aspect of the invention in the present patent application is a metal wiring of the seventh aspect of the invention, wherein the metal wiring is formed by etching in pattern formation of the metal coating formed on a base material. In the eighth aspect of the invention, since the pattern form is made by etching after a metal coating that can be easily etched has been formed on a base material as explained earlier, the metal coating removed by etching can be prevented from remaining between the adjacent metal wirings as residues that have not been completely removed by the etching. Therefore, according to the eighth aspect of the invention, it is possible to obtain a metal wiring in which there is no possibility of a shortcoming such as the residues causing a short-circuit between the adjacent metal wirings.

Advantageous Effect of the Invention

According to the present invention, it is possible to provide a metal coating having small surface roughness and superior in terms of the smoothness and the denseness and having excellent properties for etching and adhesion to a base material, to provide a method of forming such metal coating, and to provide a metal wiring formed by pattern formation of the metal coating.

BRIEF DESCRIPTION OF THE DRAWINGS

FIG. 1 is a plan view showing a method of finding an unevenness amount $D_{total}$ which is an index for evaluating the planar shape of the edge part of the metal wiring formed in the examples of the present invention.

EXPLANATION OF REFERENCED NUMERALS

| 1: | metal wiring |
|---|---|
| 2: | edge part |
| 3: | base material |
| 4: | outer configuration line |

BEST MODE FOR CARRYING OUT THE INVENTION

A metal coating according to one aspect of the invention is formed by baking after applying a metal-nanoparticles-dispersed liquid onto a surface of a base material, the metal-nanoparticles-dispersed liquid being composed of metal nanoparticles, water, and a dispersant having a molecular weight of 2000-30000 and having a solid form at room temperature (5-35°), wherein the metal coating comprises an alloy including (1) Ag and (2) at least one kind of metal selected from the group consisting of Au, Pt, Pd, Ru, Ir, Sn, Cu, Ni, Fe, Co, Ti, and In, the content ratio of Ag being 80-99.9% by atomic percent in the total quantity of the alloy, and wherein the metal coating has an average grain size of 0.2-5 µm. The content ratio of Ag is limited to the above-mentioned range because of the following reasons.

That is, if the content ratio of Ag in the alloy which forms a metal coating is less than 80% by atomic percent, the effect of Ag to afford high conductivity to the metal coating cannot be achieved, which results in decrease of conductivity of the metal coating. Also, depending on the kind of a metal in (2) above which forms the alloy together with Ag, the condition of the metal coating becomes such that it is difficult to perform etching, and consequently, in the case of forming a metal coating in a shape of metal wiring by etching, for example, the residues of the metal coating which could not be removed completely by the etching may cause a problem such as a short-circuit between adjacent metal wirings.

Also, if the content ratio of Ag exceeds 99.9% by atomic percent, the content ratio of a metal described in (2) above decreases relatively, and consequently, in the case of baking, the metal fails to achieve the effect of preventing too much growth of the grain size or generation of a void, or the effect of restraining the growth of the grain size of Ag, or the effect of making a metal coating hardly susceptible to oxidization, or the like. Accordingly, there occurs a problem that it is impossible to form a metal coating having not only smooth and dense film quality without voids but also superior conductivity.

In order to achieve the above-mentioned various effects effectively in a well balanced manner by using both of Ag and a metal mentioned in (2) above, the content ratio of Ag in the total quantity of the alloy is more preferably 90-99.9% by atomic percent, and most preferably 98-99.9% by atomic percent.

As for the metals of (2) above, it is preferable to co-use (2-1) a first metal which is at least one kind of metal selected from the group consisting of Au, Pt, Pd, Ru and Ir and which has excellent properties for the function of restraining the grain size growth of Ag and the function of making a metal coating hardly susceptible to oxidization during baking, and (2-2) a second metal which is at least one kind of metal selected from the group consisting of Sn, Cu, Ni, Fe, Co, Ti and In and which is superior in the property of restraining the grain growth of the grain size of Ag during the baking, the property of ease in etching, and the property of causing itself to be oxidized during the baking so as to improve the adhesive property of the metal coating with respect to the base material which is mainly oxide.

Also, in the case of the above-mentioned co-use, preferably the content ratio of the second metal is 0.1-2% by atomic percent, and most preferably 0.1-1% by atomic percent in the total quantity of the alloy. Thus, it is made possible to cause the above-described individual characteristics to be better exhibited while the characteristics are balanced well.

If the content ratio of the second metal is less than the above-mentioned range, the property of ease in etching and the property of improving the adhesiveness of the metal coating, which properties can be obtained by the effect of containing the second metal, may not sufficiently be achieved. Reversely, if the content ratio of the second metal is more than the above-mentioned range, the entire metal coating may become susceptible to oxidization, resulting in decrease of the conductivity or degradation of the film quality.

The first metal may be contained in the range of the content ratio equivalent to the remaining portion which is obtained by excluding Ag and the second metal from the total quantity of the alloy, and most preferably the first metal may be contained in the same content ratio as that of the second metal. Thus, by compensating the negative effect of the second metal, that is, by compensating such negative effect as the entire metal coating becoming susceptible to oxidization, resulting in decrease of the conductivity or degradation of the film quality, with the effect of the first metal which not only is hardly susceptible to oxidization but also has high heat resistance, it is possible to effectively achieve only positive effects of the second metal, that is, the effect of causing ease in etching and the effect of improving the adhesiveness of the metal coating.

In consideration of affording satisfactory conductivity to a metal coating by decreasing the crystal grain boundary which hinders the conductivity, the average grain size of the metal coating is preferably equal to or more than 0.2 µm. Also, the average grain size of the metal coating is preferably 5 µm or less in order to afford satisfactory conductivity by improving the smoothness and denseness of the metal coating and maintaining the smooth and dense conditions at a micro region of individual patterns of metal wiring, which is formed by pattern formation into a minute planar shape, for example, having a thickness of 1 µm or less, and in which a line width and an interval between adjacent lines are both equal to or less than several tens of µm.

Also, in consideration of forming a metal coating in which the above-mentioned effects are well balanced and which has superior surface smoothness and denseness as well as excellent conductivity, more preferably the average grain size of the metal coating is 0.5-3 µm.

The thickness of the metal coating may be designed in an arbitrary range according to the use of the metal coating. For example, in the case of a metal coating for forming a minute metal wiring in which a line width and a line interval are both equal to or less than several tens of μm as described above, preferably the metal coating has a thickness of 1 μm or less. Also, in view of affording satisfactory conductivity to the metal coating by means of Ag, the electrical resistivity of the metal coating is preferably 20 μΩ·cm or less.

In the present invention, the metal coating is formed by baking after a metal-nanoparticles-dispersed liquid which includes metal nanoparticles, water and a dispersant is applied to a surface of a base material. Therefore, the metal coating can be formed more easily with a productive efficiency as compared with the conventional sputtering method or the like. Also, as compared with the conventional method employing a metal-nanoparticles-dispersed liquid in which metal nanoparticles are dispersed in an organic solvent, it is possible to form a metal coating which is superior in terms of not only smooth and dense film quality but also adhesion to a base material, ease of etching, and high conductivity.

As for the metal nanoparticles, it is possible to use one or more kinds of metal nanoparticles with which a metal coating made of an alloy including the above-mentioned compositions can be formed by baking. More specifically, one kind of metal nanoparticles consisting of an alloy having the same composition as the metal coating may be used, or it is possible to use metal nanoparticles with which an alloy can be formed by baking and in which the content ratio between Ag nanoparticles and one or more kinds of metal nanoparticles consisting of metals mentioned in (2) above are adjusted according to the composition of the alloy.

For the purpose of forming a metal coating which is as dense as possible, the particle size of the metal nanoparticles is preferably 200 nm or less, and more preferably 150 nm or less, for primary particle size. The minimum of primary particle size of the metal nanoparticles is not particularly limited. However, from the viewpoint of practical use, the primary particle size is preferably 1 nm or more. In the present invention, the primary particle size of the metal nanoparticles is defined by the peak value of the particle size distribution which is measured using a particle size distribution measuring instrument utilizing a laser Doppler method.

The metal nanoparticles can be manufactured by a conventional known method, such as a hot processing method which is called an impregnation method, a liquid-phase reduction method, and a vapor-phase method. In order to manufacture metal nanoparticles by the liquid-phase reduction method, for example, a dispersant and water soluble metallic compounds which are to become metal ions for forming metal nanoparticles are dissolved in water, and in addition a reducing agent is added such that, preferably while being stirred, for a given time, ions of both metals may be subjected to reduction reaction. The metallic nanoparticle which is manufactured by the liquid phase reduction method has generally a spherical or granular shape, which is characterized in that the particle size distribution is sharp and the primary particle size is small.

The water soluble metallic compounds which become the source of metal ions are, for example, in the case of Ag, silver nitrate (I) [$AgNO_3$], silver methansulfonic acid [$CH_3SO_3Ag$], etc., and in the case of Au, tetrachloroauric acid tetrahydrate [$HAuCl_4 \cdot 4H_2O$], etc. In the case of Pt, dinitro diammineplatinum (II) (Pt(NO3)2(NH3)2), hydrogen hexachloroplatinate hexahydrate ($H_2[PtCl_6] \cdot 6H_2O$), etc. can be mentioned as examples, and in the case of Pd, palladium nitrate (II) nitric acid solution [$Pd(NO_3)_2/H_2O$], palladium chloride (II) solution [$PdCl_2$], etc. can be mentioned.

Likewise, in the case of Ru, ruthenium nitrate (III) solution [$Ru(NO_3)_3$], etc. can be named, and in the case of Ir, indium chloride (III) [$IrCl_3$], etc. can be named. In the case of Sn, tin chloride pentahydrate [$SnCl_4 \cdot 5H_2O$], etc. can be named, and in the case of Cu, copper nitrate (II) [$Cu(NO_3)_2$], copper sulfate pentahydrate [$CuSO_4 \cdot 5H_2O$], etc. can be mentioned. In the case of Ni, nickel chloride hexahydrate [$NiCl_2 \cdot 6H_2O$], nickel nitrate hexahydrate [$Ni(NO_3)_2 \cdot 6H_2O$], etc. can be mentioned.

The examples in the case of Fe are ferric nitrate hexahydrate, nonahydrate ($Fe(NO_3)_3 \cdot 6H_2O \cdot 9H_2O$), ferric-chloride tetrahydrate ($FeCl_2 \cdot 4H_2O$), ferric sulphate heptahydrate ($FeSO_4 \cdot 7H_2O$), acetylacetone iron (III) ($Fe[CH(COCH_3)_2]_3$), etc. In the case of Co, cobalt chloride hexahydrate [$CoCl_2 \cdot 6H_2O$], cobalt nitrate hexahydrate [$Co(NO_3)_2 \cdot 6H_2O$], etc., and in the case of Ti, titanium chloride (III) [$TiCl_3$], etc. can be named. In the case of In, indium chloride tetrahydrate [$InCl_3 \cdot 4H_2O$], indium nitrate trihydrate [$In(NO_3)_3 \cdot 3H_2O$], etc. can be named.

As for the reducing agent, various reducing agents which can precipitate metal nanoparticles by reducing metal ion in a liquid phase reaction system may be used. For example, the reducing agents that may be used are sodium borohydride, sodium hypophosphite, hydrazine, and transition metal ion (trivalent titanium ion, divalent cobalt ion, etc.). However, it is preferable to select and use a reducing agent having practically weakest reduction power so that the reduction and precipitation rates may be decreased, because delaying the reduction of metal ion and decreasing the precipitation rate are effective for the purpose of lessening, as much as possible, the primary particle size of the metallic nanoparticle to be precipitated.

The reducing agents having weak reduction power are, for example, alcohols such as methanol, ethanol, 2-propanol, etc., and ascorbic acid, ethylene glycol, glutathione, organic acids (citric acid, malic acid, tartaric acid, etc.), reducing saccharide (glucose, galactose, mannose, fructose, sucrose, maltose, raffinose, stachyose, etc.), and sugar alcohols (sorbitol, etc.). In particular, the reducing saccharides and the derivatives thereof such as the sugar alcohols are preferable.

The dispersants that can be used are various dispersants which can well disperse the extracted metal nanoparticles in water and which have a molecular weight of 2000-30000, a solid form at room temperature, and satisfactory solubility relative to water. The dispersant exists surrounding the extracted metal nanoparticles in the reaction system and prevents the agglomeration of the metal nanoparticles, performing the function of maintaining the dispersion.

Also, the liquid phase reaction system which has precipitated metal nanoparticles can be used as the starting raw material for adjusting the metal-nanoparticles-dispersed liquid in a state where only impurities are removed without separating metal nanoparticles from the reaction system. In such case, the dispersant, which remains little removed in the process of removing the impurities, continues to perform the function of preventing the agglomeration of the metal nanoparticles and maintaining the dispersion as described earlier hereinabove.

If the molecular weight of the dispersant is less than 2000, the dispersant may not be able to sufficiently perform the function of preventing the agglomeration of the metal nanoparticles and maintaining the dispersion. Therefore, it may occur that the metal coating, which is formed by baking the metal-nanoparticles-dispersed liquid applied onto a surface of a base material, fails to have the smooth and dense film quality without a void or the like.

Also, the dispersant having a molecular weight exceeding 30000 has a bulk which is too large, and consequently may hamper the mutual sintering of the metal nanoparticles, thereby causing voids or decreasing the denseness of film quality, in the baking process for forming a metal coating. Likewise, there may be a shortcoming such that the resolved residues of the macromolecular dispersant remain as impurities in the metal coating, thereby decreasing the conductivity of the metal coating.

On the other hand, a dispersant having a molecular weight of 2000-30000 is not only superior in the function of dispersing metal nanoparticles in a metal-nanoparticles-dispersed liquid but also has a bulk that is not too large, and therefore the dispersant neither causes the metal coating to have a void upon baking nor decreases the denseness of film quality. Moreover, the dispersant does not cause any resolved residues to remain in the metal coating; the remaining resolved residues may cause the degradation of the conductivity.

In consideration of preventing the degradation of electronic components which will be arranged at the vicinity of the metal coating when the metal coating is used in the electronics field, it is preferable that the dispersant do not contain any of sulfur, phosphorus, boron, and halogen atom.

Of dispersants having a polar group, including for example, macromolecular dispersants of amine type such as polyethylenimine and polyvinyl-pyrrolidone, macromolecular dispersants of hydrocarbon type such as polyacrylic acid, carboxymethylcellulose, etc., which have carboxylic acid function in the molecule, poval (polyvinyl alcohol), and interpolymers having a polyethylenimine part and a polyethylene oxide part in one molecule, the suitable dispersants that can meet the above-mentioned conditions are macromolecular dispersants having a molecular weight of 2000-30000. The dispersant can be added to a reaction system in a liquid state in which the dispersant is dissolved in water or water-soluble organic solvent.

In order to adjust the primary particle size of the metal nanoparticles, the kind and the combination ratio of a metallic compound, a dispersant, and a reducing agent may be adjusted, and in addition, the stirring speed, temperature, time, pH, etc. may be adjusted at the time of subjecting the metal compound to reduction reaction. For example, the pH of the reaction system is preferably 7-13 in order to form metal nanoparticles having a primary particle size that is as small as possible.

For the purpose of adjusting the pH of the reaction system within the above-mentioned range, a pH adjusting agent is used. In order to prevent the degradation of an electronic component which will be arranged at the vicinity of the metal coating when the above-mentioned metal coating or a metal coating to be formed is used in the electronics field, it is preferable to use pH adjusting agents such as nitric acid and ammonia which do not include any impurity elements, such as alkali metal, alkaline-earth metal, sulfur, phosphorus, boron, and halogen element such as chlorine.

A metal-nanoparticles-dispersed liquid may be prepared in a manner such that the metal nanoparticles extracted in a liquid phase reaction system are processed into powder through steps such as filtration, washing, drying, and cracking, and thereafter the powder of metal nanoparticles is mixed with water and a dispersant, and if necessary, further mixed with a water-soluble organic solvent, at given ratios so as to prepare the metal-nanoparticles-dispersed liquid. However, it is preferable that the liquid-phase reaction system which has extracted the metal nanoparticles be used as starting raw materials to prepare a metal-nanoparticles-dispersed liquid as described earlier hereinabove.

That is, a metal-nanoparticles-dispersed liquid is prepared in a manner in which after treatments such as ultrafiltration, centrifuging, water washing, electrodialysis, etc., are performed so as to remove impurities from the liquid phase reaction system that has extracted metal nanoparticles and that includes the metal nanoparticles and the water used for the reaction, the concentration of the metal nanoparticles is adjusted by removing water by means of concentration processing, or reversely, by adding water in accordance with the need, and thereafter, if needed, by further mixing a water-soluble organic solvent at a given ratio. This method makes it possible to form a more dense and uniform metal coating by preventing the particles from having irregular shapes due to agglomeration of metal nanoparticles.

The content ratio of water in the metal-nanoparticles-dispersed liquid is preferably 20-400 parts by weight per 100 parts by weight of metal nanoparticles. If the content ratio of water is less than such range, it may not possible to fully achieve the effect by water of swelling dispersants sufficiently and dispersing the metal nanoparticles surrounded by the dispersant, without causing agglomeration, in the metal-nanoparticles-dispersed liquid. Also, if the content ratio of water exceeds the range, the content ratio of the metal nanoparticles in the metal-nanoparticles-dispersed liquid decreases, which may result in failure to form a metal coating having sufficient thickness and density on a surface of a base material.

As to the water soluble organic solvent, various organic solvents which are soluble in water can be used. The specific examples are as follows: alcohols such as methyl alcohol, ethyl alcohol, n-propyl alcohol, isopropyl alcohol, n-butyl alcohol, isobutyl alcohol, sec-butyl alcohol, tert-butyl alcohol, etc.; ketone such as acetone, methyl ethyl ketone; polyalcohol such as glycerine, ethylene glycol, etc.; and ester, etc.

The content ratio of the water soluble organic solvent is preferably 30-900 parts by weight per 100 parts by weight of metal nanoparticles. If the content ratio of the water soluble organic solvent is less than the range, the effect afforded by the organic solvent being contained for enabling the adjustment of the vapor pressure and viscosity of the metal-nanoparticles-dispersed liquid may not sufficiently be achieved. In contrast, if the content ratio of the water soluble organic solvent exceeds the range, a surplus organic solvent may hamper the water from achieving the effect for swelling the dispersant sufficiently and dispersing well, without causing agglomeration, the metal nanoparticles surrounded by the dispersant in the metal-nanoparticles-dispersed liquid.

The content ratio of the dispersant is preferably 3-60 parts by weight per 100 parts by weight of metal nanoparticles. If the content ratio of the dispersant is less than such range, the contained dispersant may not be able to sufficiently achieve the effect of preventing the agglomeration of the metal nanoparticles by existing so as to surround the metal nanoparticles in the metal-nanoparticles-dispersed liquid which includes water. Reversely, if the content ratio of the dispersant exceeds the range, the shortcomings may be such that the surplus dispersant causes a void or decreases the denseness of the film quality by inhibiting the sintering of metal nanoparticles during the baking process, or such that the decomposed residues of the macromolecule dispersant remain as impurities in the metal coating and decrease the conductivity of the metal coating.

The metal-nanoparticles-dispersed liquid preferably has an electric conductivity of 5 mS/cm or more. At the time of forming metal nanoparticles by the liquid-phase reduction method, the electric conductivity can be changed by adjusting the content ratio of the water soluble organic solvent and the remaining quantity of the impurities such as metal ions and ammonia ions etc. as the pH adjusting agent added to the reaction system, the reducing agent, and counter ions which have formed metal salt which becomes the sources of metal nanoparticles.

Therefore, it is preferable to adjust the electric conductivity by choosing the method and the conditions for the process of removing impurities from the reaction system and by adjusting the concentration for diluting or concentrating the reaction system, as well as by adjusting the added amount of the water soluble organic solvent. The electric conductivity of the metal-nanoparticles-dispersed liquid is preferably 100 mS/cm or less. If the electric conductivity exceeds such range, the impurities will increase and remain in the metal coating after baking, which may result in the adverse effects.

The metal-nanoparticles-dispersed liquid must have a suitable viscosity for a coating method which is applied to coating onto the surface of a substrate. For such purpose, the content ratio of the total amount of water and a water soluble organic solvent which occupies in the total quantity of the metal-nanoparticles-dispersed liquid may be adjusted, or the molecular weight and the content ratio of the dispersant may be adjusted.

As for the method of forming a metal coating of the present invention, first, a metal-nanoparticles-dispersed liquid is applied to a surface of a base material. The thickness of the applied layer of the metal-nanoparticles-dispersed liquid is adjusted so as to be able to form a metal coating having a target thickness through the processes of drying and baking after coating. The recommendable coating methods are, for example, a spin coating method, a spray coating method, a bar coating method, a die coating method, a roll coating method, and a dip coating method. According to these methods, it is possible to make the thickness of the metal coating more uniform because the metal-nanoparticles-dispersed liquid can be applied uniformly to a surface of a base material.

Next, a coated film is formed by drying the metal-nanoparticles-dispersed liquid which has been applied to the surface of the base material. The conditions for the drying are set such that almost all of the water and the water soluble organic solvent can be evaporated. Then, a metal coating is formed when the coated film is subjected to baking by heating at a temperature higher than the temperature for the thermal decomposition of the dispersant so that not only can the dispersant be removed by the thermal decomposition but also the metal nanoparticles can be sintered.

The baking may be performed in the atmospheric air in order to subject the dispersant to thermal decomposition, and in order to prevent the oxidation of the metal nanoparticles, further baking may be performed in a reducing atmosphere after baking in the atmospheric air. The temperature for baking is preferably 700° C. or less, and most preferably 250-550° C., from the viewpoint of preventing the excessive growth of the grain size of metal which constitutes the metal coating formed by the baking and the generation of voids in the metal coating.

The metal wiring of the present invention is characterized in that the above-mentioned metal coating of the present invention is formed in a predetermined planar shape by pattern formation. The metal wiring can suitably be used, for example, as wiring and an electrode in a liquid crystal display (LCD) such as TFT liquid crystal, reflection-type liquid crystal, etc., a plasma display (PDP), a solar cell, a multilayer substrate, and so on.

For forming metal wiring, the method comprising the following steps can preferably be adopted: a step of forming a coated film by applying a metal-nanoparticles-dispersed liquid to a surface of a base material and drying the so-coated liquid; a step of baking the coated film at a pre-determined temperature to form a metal coating of the present invention; and a step of forming metal wiring by subjecting the metal coating to etching so as to form in a pre-determined planar shape by pattern formation, in the same manner as in the case of a metal coating prepared by means of a conventional wet plating method. According to the method, since it is easy to etch the metal coating of the present invention as explained earlier, regardless of any minute planar shape formed by pattern formation, no residues of a metal coating which could not completely be removed by etching will remain between adjacent metal wirings. Therefore, it is possible to form metal wiring which will not have a shortcoming such as short-circuit caused between adjacent metal wirings.

An etching method suitable for pattern formation of a metal coating is an etching technique utilizing photolithography that enables, with sufficient reproducibility, precise formation of a minute pattern of metal wiring. More specifically, a photoresist layer having photosensitivity is formed on a metal coating, and the resist layer is exposed and developed so as to form a resist mask for covering a region of the metal coating, which region corresponds to the pattern to be formed, and thereafter the metal coating portion which is not covered with the resist mask is removed selectively by etching in a predetermined planar shape such that metal wiring is formed by pattern formation. As to the method of etching for removing the metal coating portion which is not covered with the resist mask, either a liquid-phase method which uses an etching solution or a vapor-phase method which uses an etching gas and an ion beam may be adopted in the present invention.

The metal wiring of the present invention may be formed by baking a coated film prepared beforehand by the following manner: a metal-nanoparticles-dispersed liquid, which contains metallic nanoparticles which are to become a metal coating of the present invention, water, and a dispersant having a molecular weight of 2000-30000 and having a solid form at room temperature are applied onto a surface of a base material so that a predetermined planar shape of pattern formation may be formed by a printing method such as an ink jet printing, dispenser printing, or screen printing; and thereafter the so-applied metal-nanoparticles-dispersed liquid is dried to make the coated film. Also, the metal wiring of the present invention may be formed by the following steps: applying a metal-nanoparticles-dispersed liquid onto a surface of a base material, and forming a coated film by drying the so-applied metal-nanoparticles-dispersed liquid; and prior to the baking, the coated film is formed into a predetermined planar shape of the pattern formation by etching, which employs a photolithography method, or the like, and thereafter the baking is performed.

Moreover, the metal wiring of the present invention can be formed by combining the above-described forming methods. For example, the above-mentioned forming method using the ink jet printing may be applied for forming the whole metal wiring in a predetermined planar shape by pattern formation, and the minute part can be formed by pattern formation by means of etching using the photolithography.

More specifically, after the whole metal wiring pattern including the region which corresponds to the minute part formed as an overall-coated pattern is formed by the forming method using the ink jet printing or the like, the region of above-mentioned overall-coated pattern can be shaped into a pattern form by etching using the photolithography or the like. In such case, the shaping of the minute part by etching the overall-coated pattern may be done at a stage either prior to or after baking the coated film formed by a method using the ink jet printing or the like.

In any of the above-mentioned cases, since the metal coating of the present invention and the metal nanoparticles which constitute the metal coating can easily be etched, there will be no possibility that the residues of the metal coating which could not be removed completely by the etching remain between adjacent metal wirings which constitute the minute part. Therefore, it is possible to make metal wiring in which there will be no problem such as the above-mentioned residues causing short-circuit between the adjacent metal wirings.

EXAMPLES

Example 1

(Preparation of Metal Nanoparticles)

A liquid phase reaction system was prepared by the following steps: silver nitrate (I) and palladium nitrate (II) nitric acid solution as a metal compound were dissolved in pure water, and ammonia water was added thereto so as to adjust the pH of the solution to become 10; subsequently, polyacrylic acid (molecular weight 5000) as a macromolecule dispersant was added thereto and fully dissolved; and thereafter, the solution which was prepared by dissolving ascorbic acid as a reducing agent in pure water was added thereto. Thus, the concentration of each ingredient in the reaction system was: 25 g/liter of silver nitrate (I); 0.5 g/liter of palladium nitrate (II); 10 g/liter of polyacrylic acid; and 26 g/liter of ascorbic acid. Also, the combination ratio (atomicity ratio) of Ag and Pd contents was Ag:Pd=98.5:1.5.

The reaction system was reacted for 120 minutes at 40° C. while it was stirred at the stirring rate of 500 rpm, and alloy nanoparticles composed of alloy of Ag and Pd were precipitated in a colloidal state, which was subjected to centrifugal separation. Then, the operation to remove the impurities which were lighter than the alloy nanoparticles was repeated, and subsequently, the water soluble impurities which had melted into the centrifuged supernatant were removed by washing, which was performed by adding pure water. Thereafter, the particle size distribution of the alloy nanoparticles was measured using a particle size distribution measuring instrument in which a laser Doppler method was applied, [a particle size distribution measuring instrument, Nanotrack (registered trademark) UPA-EX150 from NIKKISO CO., LTD.], and consequently a sharp peak was found at the 25 nm position.

(Preparation of Metal-Nanoparticles-Dispersed Liquid)

The above-mentioned reaction system was heated at 70° C. using a hot bath and concentrated until the concentration of alloy nanoparticles became 60% by weight. Thereafter, ethyl alcohol was added thereto and it was stirred. Thus, a metal-nanoparticles-dispersed liquid was prepared. The content ratio of each ingredient per 100 parts by weight of alloy nanoparticles in the metal-nanoparticles-dispersed liquid was as follows: water was 27 parts by weight, ethyl alcohol was 333 parts by weight, and the polyacrylic acid was 40 parts by weight. Also, the concentration of alloy nanoparticles in the metal-nanoparticles-dispersed liquid was 20% by weight. Also, the electric conductivity of the metal-nanoparticles-dispersed liquid, which was measured using an electric conductivity measuring meter [CM-40S of DKK-TOA Corporation], was 11 mS/cm.

(Formation of Metal Coating)

The above-described metal-nanoparticles-dispersed liquid was applied, with a spin coating method (turning rate of the base material: 1000 rpm), onto a surface of a silica glass base material having a size of 5 inch square, and was dried at 100° C. for 10 minutes, so that a coated film was formed. Subsequently, the coated film was baked for 30 minutes by heating at 300° C. in a atmospheric air, so that a metal coating was formed.

The thickness of the formed metal coating, which was measured with a surface roughness measuring instrument [SURFCOM 130A of ACCRETECH (Tokyo Seimitsu) (registered trademark)], was 0.4 µm by average film thickness. Also, the arithmetic mean roughness Ra which was obtained from the results of measuring the surface texture of the metal coating by using the above-mentioned surface roughness measuring instrument was 25 nm. Thus, the metal coating was found to be dense and have a smooth surface as compared to the standard set forth hereinabove. Moreover, according to the results of measurement with an inductive coupling high frequency plasma emission analysis apparatus [CIROS-120 from Rigaku Corporation], the composition of the metal coating was Ag:Pd=98.5:1.5, which was equal to the combination ratio (atomicity ratio) of Ag and Pd. Also, the electrical resistivity of the metal coating, which was measured with a resistivity meter [LORESTA (registered trademark) GP MCP-T610, from Dia Instruments Co., Ltd], was 6 µΩ·cm. Thus, it was confirmed that the metal coating had excellent conductivity, although the value was a little higher than that of an Ag bulk.

Likewise, the metal coating was inspected with a scanning electron microscope, and consequently it was confirmed that the metal coating had a dense film quality, with the average grain size being 0.5 µm. Also, the metal coating was measured with respect to the adhesion to the surface of the base material, in accordance with Japanese Industrial Standards JIS K5600-5-6:1999 "The general test method of paint—Part 5: the mechanical characteristics of coated film—Section 6: the adhesion property (crosscut method)". As a result, there was no separation of the metal coating and it was confirmed that the metal coating had satisfactory adhesiveness.

(Formation of Metal Wiring)

A photosensitive resist material was applied onto the surface of the formed metal coating and hardened, and thereby a resist layer was formed, and thereafter the processes of exposure and development were performed. Thus, a resist mask was formed for covering the region corresponding to the pattern to be formed of the metal coating. Subsequently, the metal coating portion which was not covered with the resist mask was removed by conducting selective etching for 60 seconds at 30° C. using an Ag etching solution of a nitric acid system, which was available on the market. Thus, the metal coating was formed by pattern formation into a predetermined planar pattern. The shape of the pattern was such that a plurality of straight lines having a line width of 5 µm were arranged in parallel.

The pattern thus formed was evaluated according to the following standard on the basis of inspection performed with a scanning electron microscope. As a result, it was confirmed that the etching result was ⊚, that is, the etching was done beautifully without causing any residues.

⊚: No residues exist.
○: Residues little exist.
x: Residues exist.

Also, the line width of the resist mask prior to etching and the line width of the pattern formed by the etching were measured with a laser microscope [High-resolution Profile Laser Microscope VK-8550 from KEYENCE CORPORATION], and the amount a of side etching in the etching process was sought by the formula (I):

$$a = \text{(the line width of an etched pattern)/(the line width of a resist mask prior to etching)} \qquad (i)$$

Thus, the amount of side etching which was evaluated on the basis of the following standard was ○, and it was confirmed that the metal wiring was formed by pattern formation in a shape substantially corresponding to the shape of the resist mask, although a little side etching was recognized.

◎: a=1 (No side etching occurred.)
○: 1>a≧0.9 (A little side etching occurred.)
x: a<0.9 (Substantial side etching occurred.)

Moreover, as shown in FIG. 1, on an arbitrary straight line part at the edge part 2 of the metal wiring 1 thus formed, the planar shape of the face extending in the direction intersecting the surface of the base material 3 was observed at 10,000 times magnification using a scanning electron microscope, and in a range of 12 μm length of the straight line part, with respect to all the parts inwardly depressed relative to the assumed outer configuration line 4 (shown by the double-dot-dash straight line in the figure), the amount of each depression existing in the direction perpendicular to the outer configuration line 4 was measured to seek the maximum value $D_{in}$. Likewise, with respect to all the parts outwardly protruding relative to the assumed outer configuration line 4, the amount of each protrusion existing in the direction perpendicular to the outer configuration line 4 was measured to seek the maximum value $D_{out}$. Accordingly, the maximum value $D_{in}$ and the maximum value $D_{out}$ were added together to obtain an unevenness amount $D_{total}$ (=$D_{in}$+$D_{out}$), that is, the total amount of the depression and the protrusion. Thus, the smoothness of the edge part 2 of the metal wiring 1 was evaluated on the basis of the following standard. The evaluation result was ○, whereby it was confirmed that the edge part 2 of the metal wiring 1 was sufficiently smooth.

◎: $D_{total}$≦50 nm
○: 50 nm<$D_{total}$≦200 nm
X: 200 nm<$D_{total}$≦500 nm
XX: 500 nm<$D_{total}$ Example 2

(Preparation of Metal Nanoparticles)

The silver nitrate (I) and tetrachloroauric acid tetrahydrate, which were prepared as the metal compound, were dissolved in pure water, and the pH of the solution was adjusted to 8 by adding ammonia water. Subsequently, polyacrylic acid (molecular weight 12000) as the macromolecule dispersant was added to and completely dissolved in the solution. In addition, a solution which was prepared by dissolving galactose as a reducing agent into pure water was added to the solution. Thus, a liquid phase reaction system was prepared. The concentration of each ingredient in the reaction system was as follows: 50 g/liter of silver nitrate (I), 14 g/liter of tetrachloroauric acid tetrahydrate, 15 g/liter of the polyacrylic acid, 50 g/liter of galactose. Also, the combination ratio (atomicity ratio) of Ag and Au contents was Ag:Au=90:10.

The reaction system was reacted for 20 minutes at 80° C. while it was stirred at the stirring rate of 500 rpm, and alloy nanoparticles composed of alloy of Ag and Au were precipitated in a colloidal state, which was subjected to centrifugal separation. Then, the operation to remove the impurities which were lighter than the alloy nanoparticles was repeated, and subsequently, the water soluble impurities which had melted into the centrifuged supernatant were removed by washing, which was performed by adding pure water. Thereafter, the particle size distribution of the alloy nanoparticles was measured as in Example 1. As a result, a sharp peak was found at the 4 nm position.

(Preparation of Metal-Nanoparticles-Dispersed Liquid)

The above-mentioned reaction system was heated to a temperature of 70° C. using a hot bath and was concentrated until the concentration of the alloy nanoparticles became 50 weight %, and thereafter, acetone was added thereto and it was stirred. Thus, a metal-nanoparticles-dispersed liquid was prepared. The content ratio of each ingredient per 100 weight parts of alloy nanoparticles in the metal-nanoparticles-dispersed liquid was as follows: 90 weight parts of water, 50 weight parts of acetone, and 10 weight parts of polyacrylic acid. Also, the concentration of the alloy nanoparticles in the metal-nanoparticles-dispersed liquid was 40 weight %. The electric conductivity of the metal-nanoparticles-dispersed liquid, which was measured in the same manner as in Example 1, was 30 mS/cm.

(Formation of Metal Coating)

The above-mentioned metal-nanoparticles-dispersed liquid was applied onto a surface of a polyimide film by a dip coating method, and the so-applied liquid was dried at 100° C. for 10 minutes so as to be processed into a coated film. Subsequently, the coated film was heated to a temperature of 200° C. in an atmospheric air for 120 minutes and baked such that a metal coating was formed.

The thickness of the formed metal coating was measured as in Example 1. As a result, the average film thickness was 1.5 μm. Also, the surface texture of the metal coating was measured as in Example 1, and the arithmetic mean roughness Ra which was calculated based on the results of the measurement was 8 nm. Thus, it was confirmed that the metal coating was dense and that the surface thereof was smooth as compared to the standard described earlier hereinabove. Likewise, the composition of the metal coating, which was measured in the same manner as in Example 1, was equivalent to the combination ratio (atomicity ratio) of Ag and Au, that is, Ag:Au=90:10. Also, the electrical resistivity of the metal coating, which was measured in the same manner as in Example 1, was 8 μΩ·cm. Accordingly, it was confirmed that the conductivity of the metal coating was excellent, although the electrical resistivity was a little higher than that of the Ag bulk.

Likewise, the metal coating was inspected with a scanning electron microscope, and consequently it was confirmed that the metal coating had a dense film quality, with the average grain size being 0.3 μm. Also, the metal coating was measured in accordance with the crosscut method with respect to the adhesion to the surface of the base material. As a result, there was no separation of the metal coating and it was confirmed that the metal coating had satisfactory adhesiveness.

(Formation of Metal Wiring)

A photosensitive resist material was applied onto the surface of the formed metal coating and hardened, and thereby a resist layer was formed, and thereafter exposure and development were performed. Thus, a resist mask was formed for covering the region corresponding to the pattern to be formed of the metal coating. Subsequently, the metal coating portion which was not covered with the resist mask was irradiated with an Ar ion beam for 30 minutes at an acceleration voltage of 300 V so as to be removed by selective etching. Thus, the metal coating was formed by pattern formation into a predetermined planar pattern. The shape of the pattern was such that a plurality of straight lines having a line width of 3 μm were arranged in parallel.

The result of evaluating the etching condition of the formed pattern on the basis of the standard described earlier was ○, where the residues had occurred a little. However, it was confirmed that the residues were practically negligible since they did not cause a short circuit between adjacent wiring lines. Also, the amount of side etching in the etching process was evaluated according to the standard described earlier. The evaluation result was ⊚; it was confirmed that the metal wiring was formed by pattern formation in a corresponding shape precisely in accordance the shape of the resist mask without suffering from any side etching. Moreover, the smoothness of the edge part of the metal wiring was evaluated by seeking the unevenness amount $D_{total}(=D_{in}+D_{out})$ according to the standard described earlier. The evaluation result was ⊚; it was confirmed that the edge part was formed in a markedly smooth shape.

Example 3

(Preparation of Metal Nanoparticles)

A liquid phase reaction system was prepared in the following manner: silver nitrate (I), copper nitrate (II), and palladium nitrate (II) nitric acid solution, which were prepared as the metal compound, were dissolved in pure water, and ammonia water was added thereto so as to adjust the pH of the solution to become 12; subsequently, polyacrylic acid (molecular weight 8000) as a macromolecule dispersant was added thereto and fully dissolved; and thereafter, the solution which was prepared by dissolving hydrazine as a reducing agent in pure water was added thereto. The concentration of each ingredient in the reaction system was as follows: 10 g/liter of silver nitrate (I), 0.2 g/liter of copper nitrate (II), 0.2 g/liter of palladium nitrate (II), 5 g/liter of polyacrylic acid, and 5 g/liter of hydrazine. Also, the combination ratio (atomicity ratio) of Ag, Cu, and Pd contents was Ag:Cu:Pd=98:1:1.

The reaction system was reacted for 10 minutes at 10° C. while it was stirred at the stirring rate of 500 rpm, and alloy nanoparticles composed of alloy of Ag, Cu, and Pd were precipitated in a colloidal state, which was subjected to electrodialysis processing so that the impurities were removed. Thereafter, the particle size distribution of the alloy nanoparticles was measured as in Example 1. As a result, a sharp peak was found at the 150 nm position.

(Preparation of Metal-Nanoparticles-Dispersed Liquid)

The above-mentioned reaction system was heated to a temperature of 70° C. using a hot bath and was concentrated until the concentration of the alloy nanoparticles became 40 weight %, and thereafter, ethylene glycol was added thereto and it was stirred. Thus, a metal-nanoparticles-dispersed liquid was prepared. The content ratio of each ingredient per 100 weight parts of alloy nanoparticles in the metal-nanoparticles-dispersed liquid was as follows: 135 weight parts of water, 250 weight parts of ethylene glycol, and 15 weight parts of polyacrylic acid. Also, the concentration of the alloy nanoparticles in the metal-nanoparticles-dispersed liquid was 20 weight %. The electric conductivity of the metal-nanoparticles-dispersed liquid, which was measured in the same manner as in Example 1, was 20 mS/cm.

(Formation of Metal Coating)

The above-mentioned metal-nanoparticles-dispersed liquid was applied by a spray coating method onto a surface of a glass base material having a $SiO_x$ film, and the so-applied liquid was dried at 100° C. for 10 minutes so as to be processed into a coated film. Subsequently, the coated film was heated to a temperature of 400° C. in an atmospheric air for 15 minutes, and then further heated to a temperature of 400° C. for 15 minutes in the reducing atmosphere which consists of a nitrogen gas containing a hydrogen gas of 3%. In this manner, baking was performed so that a metal coating was formed.

The thickness of the formed metal coating was measured as in Example 1. As a result, the average film thickness was 0.6 µm. Also, the surface texture of the metal coating was measured as in Example 1, and the arithmetic mean roughness Ra which was calculated based on the results of the measurement was 10 nm. Thus, it was confirmed that the metal coating was dense and that the surface thereof was smooth as compared to the earlier described standard. Likewise, the composition of the metal coating, which was measured in the same manner as in Example 1, was equivalent to the combination ratio (atomicity ratio) of Ag, Cu, and Pd, that is, Ag:Cu:Pd=98:1:1. Also, the electrical resistivity of the metal coating, which was measured in the same manner as in Example 1, was 6 µΩ·cm. Accordingly, it was confirmed that the conductivity of the metal coating was excellent, although the electrical resistivity was a little higher than that of the Ag bulk.

Likewise, the metal coating was inspected with the scanning electron microscope, and consequently it was confirmed that the metal coating had a dense film quality, having a average grain size of 3 µm. Also, the metal coating was measured in accordance with the crosscut method with respect to the adhesion to the surface of the base material. As a result, there was no separation of the metal coating and it was confirmed that the metal coating had satisfactory adhesiveness.

(Formation of Metal Wiring)

A photosensitive resist material was applied onto the surface of the formed metal coating and hardened, and thereby a resist layer was formed, and thereafter exposure and development were performed. Thus, a resist mask was formed for covering the region corresponding to the pattern to be formed of the metal coating. Subsequently, the metal coating portion which was not covered with the resist mask was removed by conducting selective etching for 40 seconds at 40° C. using an Ag etching solution of a nitric acid system, which was available on the market. Thus, the metal coating was formed by pattern formation into a predetermined planar shape. The shape of the pattern was such that a plurality of straight lines having a line width of 50 µm were arranged in parallel.

The result of evaluating the etching condition of the formed pattern on the basis of the earlier described standard was ○, where the residues had occurred a little. However, it was confirmed that the residues were practically negligible; they did not cause a short circuit between adjacent wiring lines. Also, the amount of side etching in the etching process was evaluated according to the standard described earlier. The evaluation result was ○; it was confirmed that the metal wiring was formed by pattern formation in a corresponding shape substantially in accordance the shape of the resist mask although a little side etching was recognized. Moreover, the smoothness of the edge part of the metal wiring was evaluated by seeking the unevenness amount $D_{total}(=D_{in}+D_{out})$ according to the standard described earlier. The evaluation result was ○; thus, it was confirmed that the edge part was sufficiently smooth.

Example 4

(Preparation of Metal Nanoparticles)

A liquid phase reaction system was prepared in the following manner: silver nitrate (I), tin chloride pentahydrate, and tetrachloroauric acid tetrahydrate, which were prepared as the metal compound, were dissolved in pure water, and ammonia water was added thereto so as to adjust the pH of the solution to become 8; subsequently, polyvinyl pyrrolidone (molecular weight 20000) as a macromolecule dispersant was added thereto and fully dissolved; and thereafter, the solution which was prepared by dissolving sodium borohydride as a reducing agent in pure water was added thereto. The concentration of each ingredient in the reaction system was as follows: 25 g/liter of silver nitrate (I), 0.3 g/liter of tin chloride pentahydrate, 0.3 g/liter of tetrachloroauric acid tetrahydrate, 2 g/liter of polyvinyl pyrrolidone, and 30 g/liter of sodium borohydride. Also, the combination ratio (atomicity ratio) of Ag, Sn, and Au contents was Ag:Sn:Au=99:0.5:0.5.

The reaction system was reacted for 10 minutes at 25° C. while it was stirred at the stirring rate of 500 rpm, and alloy nanoparticles composed of alloy of Ag, Sn, and Au were precipitated in a colloidal state, which was subjected to electrodialysis processing so that the impurities were removed. Thereafter, the particle size distribution of the alloy nanoparticles was measured as in Example 1. As a result, a sharp peak was found at the 15 nm position.

(Preparation of Metal-Nanoparticles-Dispersed Liquid)

The above-mentioned reaction system was heated to a temperature of 70° C. using a hot bath and was concentrated until the concentration of the alloy nanoparticles became 50 weight %, and thereafter, n-propyl alcohol was added thereto and it was stirred. Thus, a metal-nanoparticles-dispersed liquid was prepared. The content ratio of each ingredient per 100 weight parts of alloy nanoparticles in the metal-nanoparticles-dispersed liquid was as follows: 95 weight parts of water, 800 weight parts of n-propyl alcohol, and 5 weight parts of polyvinyl pyrrolidone. Also, the concentration of the alloy nanoparticles in the metal-nanoparticles-dispersed liquid was 10 weight %. The electric conductivity of the metal-nanoparticles-dispersed liquid, which was measured in the same manner as in Example 1, was 8 mS/cm.

(Formation of Metal Coating)

The above-mentioned metal-nanoparticles-dispersed liquid was applied onto a blue sheet glass base material by a spin coating method (turning rate of the base material: 1000 rpm), and the so-applied liquid was dried at 100° C. for 10 minutes so as to be processed into a coated film. Subsequently, the coated film was heated to a temperature of 250° C. in an atmospheric air for 30 minutes, and then further heated to a temperature of 250° C. for 30 minutes in the reducing atmosphere which consists of a nitrogen gas containing a hydrogen gas of 3%. In this manner, baking was performed so that a metal coating was formed.

The thickness of the formed metal coating was measured as in Example 1. As a result, the average film thickness was 1 μm. Also, the surface texture of the metal coating was measured as in Example 1, and the arithmetic mean roughness Ra which was calculated based on the results of the measurement was 8 nm. Thus, it was confirmed that the metal coating was dense and that the surface thereof was smooth as compared to the earlier described standard. Likewise, the composition of the metal coating, which was measured in the same manner as in Example 1, was equivalent to the combination ratio (atomicity ratio) of Ag, Sn, and Au, that is, Ag:Sn:Au=99:0.5:0.5. Also, the electrical resistivity of the metal coating, which was measured in the same manner as in Example 1, was 3.5 μΩ·cm, being almost the same low level as that of the Ag bulk. Thus, it was confirmed that the conductivity of the metal coating was excellent.

Likewise, the metal coating was inspected with the scanning electron microscope, and consequently it was confirmed that the metal coating had a dense film quality, having an average grain size of 0.5 μm. Also, the metal coating was measured in accordance with the crosscut method with respect to the adhesion to the surface of the base material. As a result, there was no separation of the metal coating and it was confirmed that the metal coating had satisfactory adhesiveness.

(Formation of Metal Wiring)

A photosensitive resist material was applied onto the surface of the formed metal coating and hardened, and thereby a resist layer was formed, and thereafter exposure and development were performed. Thus, a resist mask was formed for covering the region corresponding to the pattern to be formed of the metal coating. Subsequently, the metal coating portion which was not covered with the resist mask was removed by conducting selective etching for 60 seconds at 40° C. using an Ag etching solution of a nitric acid system, which was available on the market. Thus, the metal coating was formed by pattern formation into a predetermined planar pattern. The shape of the pattern was such that a plurality of straight lines having a line width of 50 μm were arranged in parallel.

The result of evaluating the etching condition of the formed pattern on the basis of the earlier described standard was ○, where the residues had occurred a little. However, it was confirmed that the residues were practically negligible; they did not cause a short circuit between adjacent wiring lines. Also, the amount of side etching in the etching process was evaluated according to the standard described earlier. The evaluation result was ○; it was confirmed that the metal wiring was formed by pattern formation in a corresponding shape substantially in accordance the shape of the resist mask although a little side etching was recognized. Moreover, the smoothness of the edge part of the metal wiring was evaluated by seeking the unevenness amount $D_{total}(=D_{in}+D_{out})$ according to the standard described earlier. The evaluation result was ○; thus, it was confirmed that the edge part was sufficiently smooth.

Example 5

(Preparation of Metal Nanoparticles I)

A liquid phase reaction system was prepared in the following manner: silver nitrate (I) as the metal compound was dissolved in pure water, and ammonia water was added thereto so as to adjust the pH of the solution to become 11; subsequently, polyvinyl pyrrolidone (molecular weight 20000) as a macromolecule dispersant was added thereto and fully dissolved; and thereafter, the solution which was prepared by dissolving glucose as a reducing agent in pure water was added thereto. The concentration of each ingredient in the reaction system was as follows: 25 g/liter of silver nitrate (I), 10 g/liter of polyvinyl pyrrolidone, and 27 g/liter of glucose.

The reaction system was reacted for 180 minutes at 80° C. while it was stirred at the stirring rate of 500 rpm, and Ag nanoparticles were precipitated in a colloidal state, which was subjected to ultrafiltration process so that impurities were removed by repeating dilution with pure water. Thereafter, the particle size distribution of the Ag nanoparticles was measured as in Example 1. As a result, a sharp peak was found at the 15 nm position.

The above-mentioned reaction system was heated to a temperature of 70° C. using a hot bath and was concentrated until the concentration of the Ag nanoparticles became 40 weight %, and thereafter, ethylene glycol monobutyl ether was added thereto and it was stirred. Thus, dispersion liquid I was prepared.

The content ratio of each ingredient per 100 weight parts of Ag nanoparticles in the dispersion liquid I was as follows: 105 weight parts of water, 250 weight parts of ethylene glycol monobutyl ether, and 45 weight parts of polyvinyl pyrrolidone. Also, the concentration of Ag nanoparticles in the dispersion liquid I was 20 weight %. The electric conductivity of the dispersion liquid I, which was measured in the same manner as in Example 1, was 10 mS/cm.

(Preparation of Metal Nanoparticles II)

A liquid phase reaction system was prepared in the following manner: palladium nitrate (II) nitric acid solution as the metal compound was dissolved in pure water, and ammonia water was added thereto so as to adjust the pH of the solution to become 10; subsequently, polyvinyl pyrrolidone (molecular weight 20000) as a macromolecule dispersant was added thereto and fully dissolved; and thereafter, the solution which was prepared by dissolving ascorbic acid as a reducing agent in pure water was added thereto. The concentration of each ingredient in the reaction system was as follows: 3.8 g/liter of palladium nitrate (II) nitric acid, 1 g/liter of polyvinyl pyrrolidone, and 3 g/liter of ascorbic acid.

The reaction system was reacted for 180 minutes at 60° C. while it was stirred at the stirring rate of 500 rpm, and Pd nanoparticles were precipitated in a colloidal state, which was subjected to ultrafiltration process so that impurities were removed by repeating dilution with pure water. Thereafter, the particle size distribution of the alloy nanoparticles was measured as in Example 1. As a result, a sharp peak was found at the 30 nm position.

The above-mentioned reaction system was heated to a temperature of 70° C. using a hot bath and was concentrated until the concentration of the Pd nanoparticles became 40 weight %, and thereafter, ethylene glycol monobutyl ether was added thereto and it was stirred. Thus, dispersion liquid II was prepared.

The content ratio of each ingredient per 100 weight parts of Pd nanoparticles in the dispersion liquid II was as follows: 120 weight parts of water, 250 weight parts of ethylene glycol monobutyl ether, and 30 weight parts of polyvinyl pyrrolidone. Also, the concentration of Pd nanoparticles in the dispersion liquid II was 20 weight %. The electric conductivity of the dispersion liquid II, which was measured in the same manner as in Example 1, was 10 mS/cm.

(Preparation of Metal-Nanoparticles-Dispersed Liquid)

A metal-nanoparticles-dispersed liquid was prepared by combining the above-described dispersion liquids I and II at the combination ratio (atomicity ratio) such that Ag and Pd contents would become Ag:Pd=98.5:1.5. The content ratio of each ingredient per 100 weight parts of the total Ag and Pd nanoparticles in the metal-nanoparticles-dispersed liquid was as follows: 105 weight parts of water, 250 weight parts of ethylene glycol monobutyl ether, and 45 weight parts of polyvinyl pyrrolidone. Also, the concentration of the total Ag and Pd nanoparticles in the metal-nanoparticles-dispersed liquid was 20 weight %. The electric conductivity of the metal-nanoparticles-dispersed liquid, which was measured in the same manner as in Example 1, was 10 mS/cm.

(Formation of Metal Coating)

The above-described metal-nanoparticles-dispersed liquid was applied, with a spin coating method (turning rate of the base material: 1000 rpm), onto a surface of a silica glass base material having a size of 5 inch square, and was dried at 100° C. for 10 minutes, so that a coated film was formed. Subsequently, the coated film was baked for 30 minutes by heating at 300° C. in a atmospheric air, so that a metal coating was formed.

The thickness of the formed metal coating was measured as in Example 1. As a result, the average film thickness was 0.4 µm. Also, the surface texture of the metal coating was measured as in Example 1, and the arithmetic mean roughness Ra which was calculated based on the results of the measurement was 25 nm. Thus, it was confirmed that the metal coating was dense and that the surface thereof was smooth as compared to the earlier described standard. Likewise, the composition of the metal coating, which was measured in the same manner as in Example 1, was equivalent to the combination ratio (atomicity ratio) of Ag and Pd, that is, Ag:Pd=98.5:1.5. Also, the electrical resistivity of the metal coating, which was measured in the same manner as in Example 1, was 6 µΩ·cm. Thus, it was confirmed that the conductivity of the metal coating was excellent, although it was a little higher than that of the Ag bulk.

Likewise, the metal coating was inspected with the scanning electron microscope, and consequently it was confirmed that the metal coating had a dense film quality, having an average grain size of 0.5 µm. Also, the metal coating was measured in accordance with the crosscut method with respect to the adhesion to the surface of the base material. As a result, there was no separation of the metal coating and it was confirmed that the metal coating had satisfactory adhesiveness.

(Formation of Metal Wiring)

A photosensitive resist material was applied onto the surface of the formed metal coating and hardened, and thereby a resist layer was formed. Thereafter exposure and development were performed, whereby a resist mask was formed for covering the region corresponding to the pattern to be formed of the metal coating. Subsequently, the metal coating portion which was not covered with the resist mask was irradiated with an Ar ion beam for 10 minutes at an acceleration voltage of 350 V so as to be removed by selective etching. Thus, the metal coating was formed by pattern formation into a predetermined planar pattern. The shape of the pattern was such that a plurality of straight lines having a line width of 5 µm were arranged in parallel.

The result of evaluating the etching condition of the formed pattern on the basis of the standard described earlier was ○, where the residues had occurred a little. However, it was confirmed that the residues were practically negligible; they did not cause a short circuit between adjacent wiring lines. Also, the amount of side etching in the etching process was evaluated according to the standard described earlier. The evaluation result was ◎; it was confirmed that the metal wiring was formed by pattern formation in a corresponding shape precisely in accordance the shape of the resist mask without suffering from any side etching. Moreover, the smoothness of the edge part of the metal wiring was evaluated by seeking the unevenness amount $D_{total}(=D_{in}+D_{out})$ according to the standard described earlier. The evaluation result was ◎; it was confirmed that the edge part was formed in a markedly smooth shape.

Example 6

(Preparation of Metal-Nanoparticles-Dispersed Liquid)

A metal-nanoparticles-dispersed liquid was prepared in the same manner as Example 5 except that the dispersion liquid I and the dispersion liquid II were combined at the combination ratio such that the atomicity ratio of Ag and Pd would become Ag:Pd=99.5:0.5. The content ratio of each ingredient per 100 weight parts of the total Ag and Pd nanoparticles in the metal-nanoparticles-dispersed liquid was as follows: 105 weight parts of water, 250 weight parts of ethylene glycol monobutyl ether, and 45 weight parts of polyvinyl pyrrolidone. Also, the concentration of the total Ag and Pd nanoparticles in the metal-nanoparticles-dispersed liquid was 20 weight %. The electric conductivity of the metal-nanoparticles-dispersed liquid, which was measured in the same manner as in Example 1, was 10 mS/cm.

(Formation of Metal Coating)

The above-mentioned metal-nanoparticles-dispersed liquid was applied onto a blue sheet glass base material by a roll coating method, and the so-applied liquid was dried at 100° C. for 10 minutes, whereby a coated film was formed. Subsequently, the coated film was heated to a temperature of 400° C. in an atmospheric air for 15 minutes, and then further heated to a temperature of 400° C. for 15 minutes in the reducing atmosphere which consists of a nitrogen gas containing a hydrogen gas of 3%. In this manner, baking was performed, and thereby a metal coating was formed.

The thickness of the formed metal coating was measured as in Example 1. As a result, the average film thickness was 0.3 μm. Also, the surface texture of the metal coating was measured as in Example 1, and the arithmetic mean roughness Ra which was calculated based on the results of the measurement was 55 nm. Thus, it was confirmed that the metal coating was dense and that the surface thereof was smooth as compared to the earlier described standard. Likewise, the composition of the metal coating, which was measured in the same manner as in Example 1, was equivalent to the combination ratio (atomicity ratio) of Ag and Pd, that is, Ag:Pd=99.5:0.5. Also, the electrical resistivity of the metal coating, which was measured in the same manner as in Example 1, was 3 μΩ·cm, being almost the same low level as that of the Ag bulk. Thus, the conductivity of the metal coating was confirmed to be excellent.

Likewise, the metal coating was inspected with the scanning electron microscope, and consequently it was confirmed that the metal coating had a dense film quality, having an average grain size of 2 μm. Also, the metal coating was measured in accordance with the crosscut method with respect to the adhesion to the surface of the base material. As a result, there was no separation of the metal coating and it was confirmed that the metal coating had satisfactory adhesiveness.

(Formation of Metal Wiring)

A photosensitive resist material was applied onto the surface of the formed metal coating and hardened, and thereby a resist layer was formed, and thereafter exposure and development were performed. Thus, a resist mask was formed for covering the region corresponding to the pattern to be formed of the metal coating. Subsequently, the metal coating portion which was not covered with the resist mask was irradiated with an Ar ion beam for 8 minutes at an acceleration voltage of 350 V so as to be removed by selective etching. Thus, the metal coating was formed by pattern formation into a predetermined planar pattern. The shape of the pattern was such that a plurality of straight lines having a line width of 10 μm were arranged in parallel.

The result of evaluating the etching condition of the formed pattern on the basis of the standard described earlier was ○, where the residues had occurred a little. However, it was confirmed that the residues were practically negligible; they did not cause a short circuit between adjacent wiring lines. Also, the amount of side etching in the etching process was evaluated according to the standard described earlier. The evaluation result was ◎; it was confirmed that the metal wiring was formed by pattern formation in a corresponding shape precisely in accordance the shape of the resist mask without suffering from any side etching. Moreover, the smoothness of the edge part of the metal wiring was evaluated by seeking the unevenness amount $D_{total}(=D_{in}+D_{out})$ according to the standard described earlier. The evaluation result was ◎; it was confirmed that the edge part was formed in a markedly smooth shape.

Comparative Example 1

(Preparation of Metal Nanoparticles)

A liquid phase reaction system was prepared by the following steps: silver nitrate (I) and palladium nitrate (II) nitric acid solution as a metal compound were dissolved in pure water, and ammonia water was added thereto so as to adjust the pH of the solution to become 10; subsequently, polyacrylic acid (molecular weight 5000) as a macromolecule dispersant was added thereto and fully dissolved; and thereafter, the solution which was prepared by dissolving ascorbic acid as a reducing agent in pure water was added thereto. Thus, the concentration of each ingredient in the reaction system was: 25 g/liter of silver nitrate (I); 15 g/liter of palladium nitrate (II); 25 g/liter of polyacrylic acid; and 26 g/liter of ascorbic acid. Also, the combination ratio (atomicity ratio) of Ag and Pd contents was Ag:Pd=70:30.

The reaction system was reacted for 120 minutes at 80° C. while it was stirred at the stirring rate of 500 rpm, and alloy nanoparticles composed of Ag and Pd alloy were precipitated in a colloidal state, which was subjected to centrifugal separation. Then, the operation to remove the impurities which were lighter than the alloy nanoparticles was repeated, and subsequently, the water soluble impurities which had melted into the centrifuged supernatant were removed by washing, which was performed by adding pure water. Thereafter, the particle size distribution of the alloy nanoparticles was measured as in Example 1. As a result, a sharp peak was found at the 25 nm position.

(Preparation of Metal-Nanoparticles-Dispersed Liquid)

The above-mentioned reaction system was heated to a temperature of 70° C. using a hot bath and was concentrated until the concentration of the alloy nanoparticles became 50 weight %, and thereafter, ethyl alcohol was added thereto and stirred. Thus, a metal-nanoparticles-dispersed liquid was prepared. The content ratio of each ingredient per 100 weight parts of alloy nanoparticles in the metal-nanoparticles-dispersed liquid was as follows: 50 weight parts of water, 300 weight parts of ethyl alcohol, and 50 weight parts of polyacrylic acid. Also, the concentration of the alloy nanoparticles in the metal-nanoparticles-dispersed liquid was 20 weight %. The electric conductivity of the metal-nanoparticles-dispersed liquid, which was measured in the same manner as in Example 1, was 11 mS/cm.

(Formation of Metal Coating)

The above-described metal-nanoparticles-dispersed liquid was applied, with a spin coating method (turning rate of the base material: 1000 rpm), onto a surface of a silica glass base material having a size of 5 inch square, and was dried at 100° C. for 10 minutes, so that a coated film was formed. Subsequently, the coated film was baked for 30 minutes by heating at 300° C. in a atmospheric air, so that a metal coating was formed.

The thickness of the formed metal coating was measured as in Example 1. As a result, the average film thickness was 0.4 μm. Also, the surface texture of the metal coating was measured as in Example 1, and the arithmetic mean roughness Ra which was calculated based on the results of the measurement was 10 nm. Thus, it was confirmed that the metal coating was dense and that the surface thereof was smooth as compared to the earlier described standard. Likewise, the composition of the metal coating, which was measured in the same manner as in Example 1, was equivalent to the combination ratio (atomicity ratio) of Ag and Pd, that is, Ag:Pd=70:30. Also, the electrical resistivity of the metal coating, which was measured in the same manner as in Example 1, was 9 μΩ·cm, being higher than that of the Ag bulk. Thus, the metal coating was confirmed to have some degree of conductivity.

Likewise, the metal coating was inspected with the scanning electron microscope, and consequently it was confirmed that the metal coating had a dense film quality, having an average grain size of 0.5 µm. Also, the metal coating was measured in accordance with the crosscut method with respect to the adhesion to the surface of the base material. As a result, there was no separation of the metal coating and it was confirmed that the metal coating had satisfactory adhesiveness.

(Formation of Metal Wiring)

A photosensitive resist material was applied onto the surface of the formed metal coating and hardened, and thereby a resist layer was formed, and thereafter exposure and development were performed. Thus, a resist mask was formed for covering the region corresponding to the pattern to be formed of the metal coating. Subsequently, the metal coating portion which was not covered with the resist mask was removed by conducting selective etching for 120 seconds at 30° C. using an Ag etching solution of a nitric acid system, which was available on the market. Thus, the metal coating was formed by pattern formation into a predetermined planar pattern. The shape of the pattern was such that a plurality of straight lines having a line width of 50 µm were arranged in parallel.

The result of evaluating the etching condition of the formed pattern on the basis of the earlier described standard was X, where a large amount of residues were recognized. It was also confirmed that the residues caused a short circuit or the like between adjacent wiring lines. The amount of side etching in the etching process was evaluated according to the standard described earlier. The evaluation result was ○; it was confirmed that the metal wiring was formed by pattern formation in a corresponding shape substantially in accordance the shape of the resist mask although a little side etching was recognized. The smoothness of the edge part of the metal wiring was evaluated by seeking the unevenness amount $D_{total}(=D_{in}+D_{out})$ according to the standard described earlier. The evaluation result was XX; thus, it was confirmed that the edge part was formed in an uneven shape.

Comparative Example 2

(Preparation of Metal Nanoparticles)

A liquid phase reaction system was prepared by the following steps: silver nitrate (I) as a metal compound were dissolved in pure water, and ammonia water was added thereto so as to adjust the pH of the solution to become 11; subsequently, polyacrylic acid (molecular weight 5000) as a macromolecule dispersant was added thereto and fully dissolved; and thereafter, the solution which was prepared by dissolving ascorbic acid as a reducing agent in pure water was added thereto. The concentration of each ingredient in the reaction system thus prepared was: 25 g/liter of silver nitrate (I); 20 g/liter of polyacrylic acid; and 26 g/liter of ascorbic acid.

The reaction system was reacted for 120 minutes at 80° C. while it was stirred at the stirring rate of 500 rpm, and Ag nanoparticles were precipitated in a colloidal state, which was subjected to centrifugal separation. Then, the operation to remove the impurities which were lighter than the alloy nanoparticles was repeated, and subsequently, the water soluble impurities which had melted into the centrifuged supernatant were removed by washing, which was performed by adding pure water. Thereafter, the particle size distribution of the Ag nanoparticles was measured as in Example 1. As a result, a sharp peak was found at the 15 nm position.

(Preparation of Metal-Nanoparticles-Dispersed Liquid)

The above-mentioned reaction system was heated to a temperature of 70° C. using a hot bath and was concentrated until the concentration of the alloy nanoparticles became 40 weight %, and thereafter, pure water was added thereto and stirred. Thus, a metal-nanoparticles-dispersed liquid was prepared. The content ratio of each ingredient per 100 weight parts of Ag nanoparticles in the metal-nanoparticles-dispersed liquid was as follows: 350 weight parts of water, and 50 weight parts of polyacrylic acid. Also, the concentration of the Ag nanoparticles in the metal-nanoparticles-dispersed liquid was 20 weight %. The electric conductivity of the metal-nanoparticles-dispersed liquid, which was measured in the same manner as in Example 1, was 20 mS/cm.

(Formation of Metal Coating)

The above-mentioned metal-nanoparticles-dispersed liquid was applied onto a blue sheet glass base material by a spray coating method, and the so-applied liquid was dried at 100° C. for 10 minutes, whereby a coated film was formed. Subsequently, baking was performed by heat the coated film to a temperature of 400° C. in an atmospheric air for 30 minutes, and thereby a metal coating was formed.

The thickness of the formed metal coating was measured as in Example 1. As a result, the average film thickness was 0.35 µm. Also, the surface texture of the metal coating was measured as in Example 1, and the arithmetic mean roughness Ra which was calculated based on the results of the measurement was 180 nm. Thus, it was found that the metal coating was not dense, the surface thereof being unsmooth, as compared to the earlier described standard. Likewise, the composition of the metal coating, which was measured in the same manner as in Example 1, was found to consist of Ag only. Also, the electrical resistivity of the metal coating, which was measured in the same manner as in Example 1, was 200 µΩ·cm, being extremely high. Thus, the conductivity of the metal coating was found to be insufficient for practical use.

Likewise, the metal coating was inspected with the scanning electron microscope, and consequently it was found that the metal coating had an average grain size as large as 8 µm, the film quality being not dense. Also, the metal coating was measured in accordance with the crosscut method with respect to the adhesion to the surface of the base material. As a result, of 25 squares, there were 20 squares in which separation of the metal coating was recognized. Thus, it was confirmed that the metal coating had a poor adhesive property.

(Formation of Metal Wiring)

A photosensitive resist material was applied onto the surface of the formed metal coating and hardened, and thereby a resist layer was formed, and thereafter exposure and development were performed. Thus, a resist mask was formed for covering the region corresponding to the pattern to be formed of the metal coating. Subsequently, the metal coating portion which was not covered with the resist mask was removed by conducting selective etching for 50 seconds at 30° C. using an Ag etching solution of a nitric acid system, which was available on the market. Thus, the metal coating was formed by pattern formation into a predetermined planar pattern. The shape of the pattern was such that a plurality of straight lines having a line width of 20 µm were arranged in parallel.

The result of evaluating the etching condition of the formed pattern on the basis of the earlier described standard was ○, where there were a little amount of residues. However, it was confirmed that the residues were negligible for practical use, not causing a short circuit or the like between adjacent wiring lines. The amount of side etching in the etching process was evaluated according to the standard described earlier. The evaluation result was X, there being a large side etching. Thus, it was confirmed that the metal wiring was not formed by pattern formation in a corresponding shape in accordance the shape of the resist mask. The smoothness of the edge part of the metal wiring was evaluated by seeking the unevenness amount $D_{total}$ (=$D_{in}$+$D_{out}$) according to the standard described earlier. The evaluation result was ○; thus, it was confirmed that the edge part was sufficiently smooth.

Comparative Example 3

(Preparation of Metal-Nanoparticles-Dispersed Liquid)

A metal-nanoparticles-dispersed liquid was prepared in the same manner as in Example 1 except that, after alloy nanoparticles were precipitated in a colloidal state, the reaction system was subjected to ultrafiltration process so that impurities were removed by repeating dilution with pure water, and except that the concentrating amount of the reaction system and the adding amount of ethyl alcohol were adjusted so that the concentration of each ingredient per 100 weight parts of alloy nanoparticles in the metal-nanoparticles-dispersed liquid was 27 weight parts of water, 333 weight parts of ethyl alcohol, and 40 g/liter of polyacrylic acid. The concentration of the alloy nanoparticles in the metal-nanoparticles-dispersed liquid was 20 weight %. Also, the electric conductivity of the metal-nanoparticles-dispersed liquid, which was measured in the same manner as in Example 1, was 3 mS/cm.

(Formation of Metal Coating)

The above-described metal-nanoparticles-dispersed liquid was applied, with a spin coating method (turning rate of the base material: 1000 rpm), onto a surface of a silica glass base material having a size of 5 inch square, and was dried at 100° C. for 10 minutes, so that a coated film was formed. Subsequently, the coated film was baked for 30 minutes by heating at 300° C. in an atmospheric air, so that a metal coating was formed.

The thickness of the formed metal coating was measured as in Example 1. As a result, the average film thickness was 0.4 µm. Also, the surface texture of the metal coating was measured as in Example 1, and the arithmetic mean roughness Ra which was calculated based on the results of the measurement was 120 nm. Thus, it was confirmed that the metal coating was not dense and that the surface thereof was unsmooth as compared to the earlier described standard. Likewise, the composition of the metal coating, which was measured in the same manner as in Example 1, was equivalent to the combination ratio (atomicity ratio) of Ag and Pd, that is, Ag:Pd=98.5:1.5. Also, the electrical resistivity of the metal coating, which was measured in the same manner as in Example 1, was 12 µΩ·cm, being higher than that of the Ag bulk. Thus, the metal coating was confirmed to have some degree of conductivity.

Likewise, the metal coating was inspected with the scanning electron microscope, and consequently it was confirmed that the metal coating had a number of voids and did not have dense film quality, the average grain size being as large as 6 µm. Also, the metal coating was measured in accordance with the crosscut method with respect to the adhesion to the surface of the base material. As a result, there was no separation of the metal coating and it was confirmed that the metal coating had satisfactory adhesiveness.

(Formation of Metal Wiring)

A photosensitive resist material was applied onto the surface of the formed metal coating and hardened, and thereby a resist layer was formed, and thereafter exposure and development were performed. Thus, a resist mask was formed for covering the region corresponding to the pattern to be formed of the metal coating. Subsequently, the metal coating portion which was not covered with the resist mask was irradiated with an Ar ion beam for 10 minutes at an acceleration voltage of 300 V so as to be removed by selective etching. Thus, the metal coating was formed by pattern formation into a predetermined planar pattern. The shape of the pattern was such that a plurality of straight lines having a line width of 3 µm were arranged in parallel.

The result of evaluating the etching condition of the formed pattern on the basis of the standard described earlier was ○, where the residues had occurred a little. However, it was confirmed that the residues were practically negligible; they did not cause a short circuit between adjacent wiring lines. Also, the amount of side etching in the etching process was evaluated according to the standard described earlier. The evaluation result was ⊚; it was confirmed that the metal wiring was formed by pattern formation in a corresponding shape precisely in accordance the shape of the resist mask without suffering from any side etching. The smoothness of the edge part of the metal wiring was evaluated by seeking the unevenness amount $D_{total}$ (=$D_{in}$+$D_{out}$) according to the standard described earlier. The evaluation result was X, which confirmed that the edge part was formed in an uneven shape.

Comparative Example 4

A metal coating was formed in the same manner as in Example 3 except that ethylene glycol having a molecular weight of 46 was used as the dispersant and except that the concentration of ethylene glycol in the reaction system was 350 g/liter. However, the formed metal coating had too many voids to measure the characteristics of the film.

Comparative Example 5

A metal coating was formed as in Example 3 except that the temperature for baking the coated film was 750° C. in both the atmospheric air and the reducing atmosphere. The average film thickness of the formed metal coating, which was measured in the same manner as in Example 1 was 0.6 µm. Also, the surface texture of the metal coating was measured as in Example 1, and the arithmetic mean roughness Ra which was calculated based on the results of the measurement was 500 nm. Thus, it was found that the metal coating was not dense, the surface thereof being unsmooth, as compared to the earlier described standard. The composition of the metal coating, which was measured in the same manner as in Example 1, was equivalent to the combination ratio (atomicity ratio) of Ag, Cu, and Pd, that is, Ag:Cu:Pd=98:1:1. Also, the electrical resistivity of the metal coating, which was measured in the same manner as in Example 1, was 450 µΩ·cm, being extremely high. Thus, the metal coating was found to have conductivity that was insufficient for practical use.

Likewise, the metal coating was inspected with the scanning electron microscope, and consequently it was confirmed that the metal coating did not have dense film quality, the average grain size being as large as 20 µm. Also, the metal coating was measured in accordance with the crosscut method with respect to the adhesion to the surface of the base material. As a result, there was no separation of the metal coating and it was confirmed that the adhesive property of the metal coating was satisfactory.

(Formation of Metal Wiring)

A photosensitive resist material was applied onto the surface of the formed metal coating and hardened, and thereby a resist layer was formed, and thereafter exposure and development were performed. Thus, a resist mask was formed for covering the region corresponding to the pattern to be formed of the metal coating. Subsequently, the metal coating portion which was not covered with the resist mask was removed by conducting selective etching for 40 seconds at 40° C. using an Ag etching solution of a nitric acid system, which was available on the market. Thus, the metal coating was formed by pattern formation into a predetermined planar pattern. The shape of the pattern was such that a plurality of straight lines having a line width of 50 μm were arranged in parallel.

The result of evaluating the etching condition of the formed pattern on the basis of the earlier described standard was ○, where there were a little amount of residues. However, it was confirmed that the residues were negligible for practical use, not causing a short circuit or the like between adjacent wiring lines. The amount of side etching in the etching process was evaluated according to the standard described earlier. The evaluation result was ○; it was confirmed that the metal wiring was formed by pattern formation in a corresponding shape substantially in accordance the shape of the resist mask although a little side etching was recognized. The smoothness of the edge part of the metal wiring was evaluated by seeking the unevenness amount $D_{total}$ ($=D_{in}+D_{out}$) according to the standard described earlier. The evaluation result was X; thus, it was confirmed that the edge part was formed in an uneven shape.

The above-described results are summarized in Table I-Table IV

TABLE I

| | Metal-nanoparticles-dispersed liquid | | | | | |
|---|---|---|---|---|---|---|
| | Metal nanoparticles | | | Dispersant | | Electric |
| | Type of metal | Content ratio (atomic %) | Primary particle size (nm) | Kind (*1) | Molecular weight | Water-soluble organic solvent | conductivity (mS/cm) |
| Example 1 | Ag—Pd | 98.5:1.5 | 25 | PA | 5000 | EtOH | 11 |
| Example 2 | Ag—Au | 90:10 | 4 | PA | 12000 | acetone | 30 |
| Example 3 | Ag—Cu—Pd | 98:1:1 | 150 | PA | 8000 | EG | 20 |
| Example 4 | Ag—Sn—Au | 99:0.5:0.5 | 15 | PVP | 20000 | PrOH | 8 |
| Example 5 | Ag—Pd | 98.5:1.5 | 15(Ag)•30(Pd) | PVP | 20000 | EGMBA | 10 |
| Example 6 | Ag—Pd | 99.5:0.5 | 15(Ag)•30(Pd) | PVP | 20000 | EGMBA | 10 |
| Comparative Example 1 | Ag—30Pd | 70:30 | 25 | PA | 5000 | EtOH | 11 |
| Comparative Example 2 | Ag | 100 | 15 | PA | 5000 | — | 20 |
| Comparative Example 3 | Ag—Pd | 98.5:1.5 | 25 | PA | 5000 | EtOH | 3 |
| Comparative Example 4 | Ag—Cu—Pd | 98:1:1 | 150 | EG | 46 | EG | 20 |
| Comparative Example 5 | Ag—Cu—Pd | 98:1:1 | 150 | PA | 8000 | EG | 20 |

(*1) PA: polyacrylic acid, PVP: polyvinyl pyrrolidone, EG: ethylene glycol
(*2) EtOH: ethyl alcohol, EG: ethylene glycol, PrOH: n-propyl alcohol, EGMBA: ethylene glycol monobutyl ether

TABLE II

| | Coating application | | Drying | Baking | |
|---|---|---|---|---|---|
| | Base material | Method | (° C.-min) | Atmosphere | Conditions (° C.-min) |
| Example 1 | Silica glass | Spin | 100-10 | Atmospheric air | 300-30 |
| Example 2 | Polyimide film | Dip | 100-10 | Atmospheric air | 200-12 |
| Example 3 | Glass with SiO$_x$ film | Spray | 100-10 | Atmospheric air →H$_2$(3%)N$_2$ | 400-15 →400-15 |
| Example 4 | Blue sheet glass | Spin | 100-10 | Atmospheric air →H$_2$(3%)N$_2$ | 250-30 →250-3 |
| Example 5 | Silica glass | Spin | 100-10 | Atmospheric air | 300-30 |
| Example 6 | Blue sheet glass | Roll | 100-10 | Atmospheric air →H$_2$(3%)N$_2$ | 400-15 →400-15 |
| Comparative Example 1 | Silica glass | Spin | 100-10 | Atmospheric air | 300-30 |
| Comparative Example 2 | Blue sheet glass | Spray | 100-10 | Atmospheric air | 300-30 |
| Comparative Example 3 | Silica glass | Spin | 100-10 | Atmospheric air | 300-30 |
| Comparative Example 4 | Glass with SiO$x$ film | Spray | 100-10 | Atmospheric air →H$_2$(3%)N$_2$ | 400-15 →400-15 |
| Comparative Example 5 | Glass with SiO$x$ film | Spray | 100-10 | Atmospheric air →H$_2$(3%)N$_2$ | 750-15 →750-15 |

TABLE III

| | Metal coating | | | | | | | |
|---|---|---|---|---|---|---|---|---|
| | Film thickness (μm) | Ra (μm) | Type of metal | Content ratio (atomic %) | Resistivity (μΩ·cm) | Average grain size (μm) | Void | Crosscut (Number of non-separation) |
| Example 1 | 0.4 | 25 | Ag—Pd | 98.5:1.5 | 6 | 0.5 | Nil | 25/25 |
| Example 2 | 1.5 | 8 | Ag—Au | 90:10 | 8 | 0.3 | Nil | 25/25 |
| Example 3 | 0.6 | 10 | Ag—Cu—Pd | 98:1:1 | 6 | 3 | Nil | 25/25 |
| Example 4 | 1 | 8 | Ag—Sn—Au | 99:0.5:0.5 | 3.5 | 0.5 | Nil | 25/25 |
| Example 5 | 0.4 | 25 | Ag—Pd | 98.5:1.5 | 6 | 0.5 | Nil | 25/25 |
| Example 6 | 0.3 | 55 | Ag—Pd | 99.5:0.5 | 3 | 2 | Nil | 25/25 |
| Comparative Example 1 | 0.4 | 10 | Ag—30Pd | 70:30 | 9 | 0.5 | Nil | 25/25 |
| Comparative Example 2 | 0.35 | 180 | Ag | 100 | 200 | 8 | Exists | 5/25 |
| Comparative Example 3 | 0.4 | 120 | Ag—Pd | 98.5:1.5 | 12 | 6 | Exists | 25/25 |
| Comparative Example 4 | — | — | — | — | — | — | Many exist | — |
| Comparative Example 5 | 0.6 | 500 | Ag—Cu—Pd | 98:1:1 | 450 | 20 | Nil | 25/25 |

TABLE IV

| | Metal wiring | | | | | |
|---|---|---|---|---|---|---|
| | Etching | | Line width (μm) | Residues | Side etching | Edge part smoothness |
| | Kind | Conditions | | | | |
| Example 1 | liquid-phase method | 30° C.-S | 5 | ◉ | ○ | ○ |
| Example 2 | vapor-phase method | 300 V-min | 3 | ○ | ◉ | ◉ |
| Example 3 | liquid-phase method | 40° C.-s | 50 | ○ | ○ | ○ |
| Example 4 | liquid-phase method | 40° C.-s | 50 | ○ | ○ | ○ |
| Example 5 | vapor-phase method | 350 V-min | 5 | ○ | ◉ | ◉ |
| Example 6 | vapor-phase method | 350 V-min | 10 | ○ | ◉ | ◉ |
| Comparative Example 1 | liquid-phase method | 30° C.-s | 50 | x | ○ | xx |
| Comparative Example 2 | liquid-phase method | 30° C.-s | 20 | ○ | x | ○ |
| Comparative Example 3 | | 300 V-min | 3 | ○ | ◉ | x |
| Comparative Example 5 | liquid-phase method | 40° C.-s | 50 | ○ | ○ | x |

The metal coating formed on the surface of the base material in Example 3 was processed, by a known etching method using an technique for forming a thin film transistor (TFT), into a plurality of TFT gate electrodes and wiring connected to each gate electrode. That is, first, a resist mask was formed by the steps of applying posi-type photosensitive resist on the metal coating of a base material; prebaking; exposure through a photomask; removal of photo-soluble part by special rinse liquid; and washing.

Next, an etching solution was prepared by combining 63 weight parts of 85% phosphate, 3 weight parts of 70% nitric acid, 6 weight parts of glacial acetic acid, and 28 weight parts of pure water. The above-mentioned base material was immersed in the etching solution, and etching was performed for 60 minutes at 30° C., so that the plurality of gate electrodes and the wiring which was connected with each gate electrode were formed. The electrode width of the gate electrode was 50 μm.

Example 7

Subsequently, a gate insulation layer, a semiconductor layer, a gate insulation layer, etc. were formed by a known method on the gate electrodes and the like which were formed on the above-mentioned base material. Then, after the SiN surface in the upper surface of the uppermost gate insulation layer was processed by oxygen plasma so as to become hydrophilic, an ink pattern having a width of 50 μm was formed directly on the so-processed hydrophilic surface. For forming the ink pattern, the metal-nanoparticles-dispersed liquid which was prepared in the same manner as in Example 1 was used as a conductive ink composition for the ink-jet printer.

Thereafter, the ink pattern was prebaked by heating at 100° C. for 10 minutes and further baked by heating at 300° C. for 30 minutes so that a metal coating was formed. This metal coating was subjected to the processes of forming a resist mask and etching in the same manner as described above, whereby a source electrode and a drain electrode were formed. These electrodes both had an electrode width of 15 μm and a channel width of 4 μm.

The plasma CVD, in which tertaethoxy silane, oxygen gas, etc. were used as the raw materials, was applied onto the basic structure of TFT which was formed by the above-described processes. Thus, a $SiO_2$ protective film was formed. A TFT device could be manufactured by forming terminals after a photosensitive acrylic resin layer was formed on the $SiO_2$ protection film.

The invention claimed is:

1. A metal coating formed by baking after applying a metal-nanoparticles-dispersed liquid onto a surface of a base material, the metal-nanoparticles-dispersed liquid being composed of metal nanoparticles, water, and a dispersant having a molecular weight of 2000-30000 and having a solid form at room temperature, wherein:
   the metal coating has an average grain size of 0.2-5 μm,
   the electrical resistivity of the metal coating is 20 μΩ·cm or less,
   the metal coating comprises: an alloy including Ag, at least one first metal selected from the group consisting of Au, Pt, Pd, Ru, and Ir, and at least one second metal selected from the group consisting of Sn, Cu, Ni Fe, Co, Ti and In,
   the content ratio of Ag being 90-99.9% by atomic percent in the total quantity of the alloy,
   the content ratio of the second metal is 0.1-2% by atomic percent in the total quantity of the alloy, and
   the metal coating has an arithmetic mean roughness Ra of 100 nm or less.

2. A metal coating as set forth in claim 1, wherein the metal coating is formed using a metal-nanoparticles-dispersed liquid containing a water soluble organic solvent.

3. A metal coating as set forth in claim 1, wherein the metal coating is formed using a metal-nanoparticles-dispersed liquid having an electric conductivity of 5 mS/cm or more.

4. A method of forming a metal coating set forth in claim 1, comprising the steps of:
   applying the metal-nanoparticles-dispersed liquid onto a surface of a base material, the metal-nanoparticles-dispersed liquid being composed of metal nanoparticles, water and a dispersant having a molecular weight of 2000-30000 and having a solid form at room temperature;
   forming a coated film by drying the so-applied liquid; and
   forming the metal coating by baking the coated film at a temperature of 700° C. or less.

5. A metal wiring formed by pattern formation of a metal coating set forth in claim 1.

6. A metal wiring as set forth in claim 5, wherein the metal wiring is made by etching in pattern formation of the metal coating formed on a base material.

* * * * *